(12) United States Patent  
Masleid et al.

(10) Patent No.: US 9,406,364 B2
(45) Date of Patent: Aug. 2, 2016

(54) CODEC TO REDUCE SIMULTANEOUSLY SWITCHING OUTPUTS

(71) Applicant: Oracle International Corporation, Redwood City, CA (US)

(72) Inventors: Robert P. Masleid, Monte Sereno, CA (US); Don Draper, San Jose, CA (US); Venkat Krishnaswamy, Los Altos, CA (US); Paul Loewenstein, Palo Alto, CA (US)

(73) Assignee: Oracle International Corporation, Redwood Shores, CA (US)

( * ) Notice: Subject to any disclaimer, the term of this patent is extended or adjusted under 35 U.S.C. 154(b) by 28 days.

(21) Appl. No.: 14/310,269

(22) Filed: Jun. 20, 2014

(65) Prior Publication Data

US 2015/0371693 A1    Dec. 24, 2015

Related U.S. Application Data

(60) Provisional application No. 61/846,403, filed on Jul. 15, 2013.

(51) Int. Cl.
*G11C 29/00* (2006.01)
*G11C 8/10* (2006.01)
*G11C 8/06* (2006.01)

(52) U.S. Cl.
CPC ... *G11C 8/10* (2013.01); *G11C 8/06* (2013.01)

(58) Field of Classification Search
CPC ..................................... G11C 8/10; G11C 8/06
See application file for complete search history.

(56) References Cited

U.S. PATENT DOCUMENTS

| 5,077,721 | A   | * | 12/1991 | Sako ................... | G11B 20/1426 |
|           |     |   |         |                        | 360/40 |
| 6,128,244 | A   | * | 10/2000 | Thompson .............. | G11C 8/00 |
|           |     |   |         |                        | 365/189.04 |
| 6,198,413 | B1  | * | 3/2001  | Widmer ................. | H03M 5/00 |
|           |     |   |         |                        | 341/58 |
| 6,721,918 | B2  |   | 4/2004  | Self et al. |  |
| 6,763,406 | B1  |   | 7/2004  | Devanney et al. |  |
| 7,068,558 | B2  | * | 6/2006  | Cho ........................ | G11C 8/08 |
|           |     |   |         |                        | 365/222 |
| 7,519,893 | B2  |   | 4/2009  | Newcomb et al. |  |
| 7,764,792 | B1  |   | 7/2010  | Avivi et al. |  |
| 8,223,042 | B2  |   | 7/2012  | Abbasfar |  |
| 2005/0094460 | A1 | * | 5/2005 | Cho ........................ | G11C 8/08 |
|           |     |   |         |                        | 365/222 |
| 2006/0236163 | A1 | * | 10/2006 | Hartmann .............. | G11C 29/18 |
|           |     |   |         |                        | 714/718 |
| 2007/0217312 | A1 |   | 9/2007 | Newcomb et al. |  |

* cited by examiner

*Primary Examiner* — M. Mujtaba K Chaudry

(74) *Attorney, Agent, or Firm* — Meyertons Hood Kivlin Kowert & Goetzel

(57) ABSTRACT

Embodiments of an apparatus and method for encoding data are disclosed that may allow for reduced simultaneous switching output noise. The apparatus may include a row decode circuit, a column decode circuit, and a memory array. The row decode circuit and column decode circuits may be configured to decode a first portion and a second portion, respectively, of a given data word of a first plurality of data words, where each data word may include N data bits, and where N is an integer greater than one. The memory array may be configured to store a second plurality of data words where each data word may include M data bits, and where M is an integer greater than N. The memory array may be further configured to retrieve a given data word of the second plurality of data words dependent upon the decoded first and second portions.

20 Claims, 11 Drawing Sheets

US 9,406,364 B2

CODEC TO REDUCE SIMULTANEOUSLY SWITCHING OUTPUTS

PRIORITY INFORMATION

The present application claims benefit of priority to U.S. Provisional Patent Application No. 61/846,403, entitled "CODEC TO REDUCE SIMULTANEOUSLY SWITCHING OUTPUTS," filed Jul. 15, 2013.

BACKGROUND

1. Technical Field

Embodiments described herein are related to the field of high-speed interface design, and more particularly to AC coupling techniques.

2. Description of the Related Art

Computing systems typically include a number of interconnected integrated circuits. In some cases, the integrated circuits may communicate through parallel interfaces, which simultaneously communicate multiple bits of data. In other cases, the integrated circuits may employ a serial interface, which sequentially communicates one bit of data at a time. In some cases, both parallel and serial interfaces, individual bits of communicated data may be differentially encoded.

In a computing system, the integrated circuits may have different power supply requirements, which may result in different output voltages being coupled to the integrated circuits' respective communication ports. Furthermore, variations in the properties of wiring traces on circuit boards as well as differences in power supply performance, may further contribute to differences in the power supply voltages supplied to the integrated circuits. Switching of output circuits during the transmission of data from one integrated circuit to another may further contribute to variations in the voltage levels of the power supplies.

To ensure overall system performance, additional margin may be added into the design to compensate for the variation in power supply voltage levels. In some cases, additional area and power may be consumed to ensure that sub-circuits within an integrated circuit can perform at level better than specified. By designing circuits in such a fashion, operation during periods of variation in power supply voltage levels may be maintained.

SUMMARY OF THE EMBODIMENTS

Various embodiments of an apparatus to encode data are disclosed. Broadly speaking, a system and method are contemplated that includes a row decode circuit, a column decode circuit, and a memory array coupled to the row decode circuit and the column decode circuit. The row decode circuit may be configured to decode a first portion of a given data word of a first plurality of data words. Each data word of the first plurality of data words may include N data bits, where N is an integer greater than one. The column decode circuit may be configured to decode a second portion, distinct from the first portion, of the given data word of the first plurality of data words. The memory array may be configured to store a second plurality of data words, where in each data word of the second plurality of data words includes M data bits, and where M is an integer greater than N, and retrieve a given data word of the plurality of data words dependent upon the decoded first and second portions of the given data word of the first plurality of data words.

In one embodiment, each data word of the second plurality of data words includes an equal number of logic 1 values and logic 0 values.

In another specific embodiment, the apparatus further includes an Error Correction Code (ECC) unit, wherein the ECC unit is configured to generate an ECC for each data word of the first plurality of data words.

BRIEF DESCRIPTION OF THE DRAWINGS

The following detailed description makes reference to the accompanying drawings, which are now briefly described.

Figure 1:
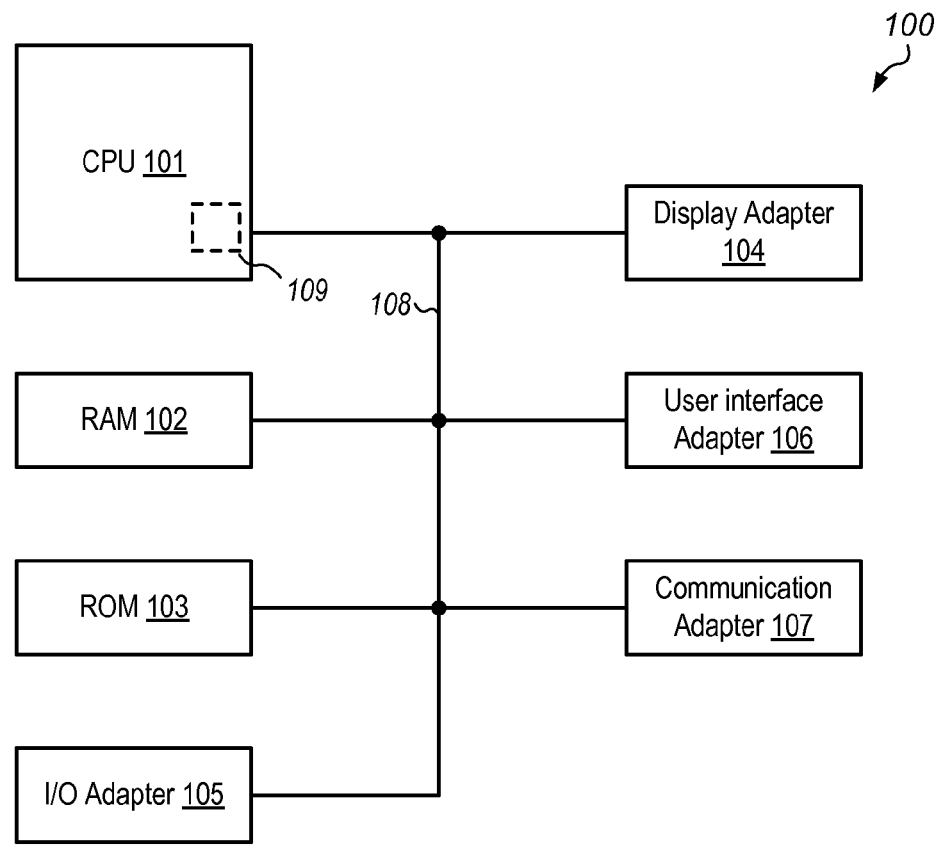
FIG. 1 illustrates an embodiment of a computing system.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph (f) interpretation for that unit/circuit/component. More generally, the recitation of any element is expressly intended not to invoke 35 U.S.C. §112, paragraph (f) interpretation for that element unless the language "means for" or "step for" is specifically recited.

DETAILED DESCRIPTION OF EMBODIMENTS

A computing system may include one or more integrated circuits, such as, e.g., a central processing unit (CPU) and memories. Each one of the integrated circuits of the computing system may communicate through either a serial or parallel interface. In a parallel interface, multiple data bits are communicated simultaneously, while in a serial interface, data is communicated as a series of sequential single data bits. The data may be communicated in accordance to one of various communication protocols.

Data communicated between integrated circuits of the computing system may be transmitted over a collection of wires (also referred to herein as a "bus"). In order to change the logic state of a wire on the bus, charge may be applied to the wire, or charge may be removed, i.e., discharged from the wire. In the case of a parallel interface between integrated circuits, multiple wires may be charged or discharged in parallel, commonly referred to as "simultaneous switching."

Simultaneous switching during data transmission may result in higher power consumption within a computing system in addition to power supply and ground noise. In some cases, sub-circuits within the integrated circuits of the computing system may be designed with additional margin to combat reductions in performance resulting from power supply and ground noise. The embodiments illustrated in the drawings and described herein may provide techniques for encoding and transmitting data from one integrated circuit to another that reduces the noise generated by the simultaneous switching of outputs, thereby saving power and improving operating margin in the computing system.

Computing System Overview

A block diagram of a computing system is illustrated in FIG. 1. In the illustrated embodiment, the computing system 100 includes a CPU 101 coupled to Random Access Memory (RAM) 102, Read-only Memory (ROM) 103, and display adapter 104. CPU 101 is additionally coupled to input/output (I/O) adapter 105, user interface adapter 106, and communications adapter 107. In various embodiments, computing system 100 may be configured as a desktop system, a laptop system, or in any suitable form factor.

RAM 102 may include any suitable type of memory, such as Fully Buffered Dual Inline Memory Module (FB-DIMM), Double Data Rate or Double Data Rate 2 Synchronous Dynamic Random Access Memory (DDR/DDR2 SDRAM), or Rambus® DRAM (RDRAM®), for example. It is noted that although one RAM is shown, in various embodiments, any suitable number of RAMs may be employed.

CPU 101 may implement any suitable instruction set architecture (ISA), such as, e.g., the SPARC™, PowerPC™, or x86 ISAs, or combination thereof. In some embodiments, CPU 101 may include one or more processor cores configured to implement one of the aforementioned ISAs. CPU 101 may also include one or more cache memories which may be configured to store instructions and/or data during operation. In other embodiments, CPU 101 may include power management unit 110 which may be configured to process and manage requests for changes in the power status of system 100. For example, power management unit 110 may respond to a system request for entry into sleep mode by generating a sleep mode signal that may cause portions of CPU 101, such as bus transceiver unit 109, for example, to power down. In some embodiments, power management unit 110 may coordinate the orderly power up of CPU 101 by generating one or more power up signals each of which may activate a different portion of the circuits within CPU 101.

CPU 101 may include one or more bus transceiver units 109 that allow CPU 101 to connect to bus 108. In some embodiments, bus 108 may be a high-speed serial interface that may conform to an industry standard specification, such as, e.g., PCI Express™, or MIPI Physical Layer. In some embodiments, the various circuits block, such as, e.g., CPU 101, may be coupled to bus 108 through a capacitor (this is commonly referred to as being "AC coupled").

ROM 103 may be configured to store instructions to be executed by CPU 101. In some embodiments, ROM 103 may store instructions necessary for initial boot-up and configuration of CPU 101. The stored instructions may include, in some embodiments, instructions to perform a power-on self-test (POST) that may allow CPU 101 to test embedded cache memories and other circuit blocks that may reside on CPU 101. In some embodiments, ROM 103 may be mask-programmable using a metal, polysilicon, contact, implant, or any suitable mask layer available on a semiconductor manufacturing process.

I/O adapter 105 may be configured to coordinate data transfer between CPU 101 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, I/O adapter 105 may be configured to implement a version of Universal Serial Bus (USB) protocol or IEEE 1394 (Firewire®) protocol.

Communication adapter 107 may be configured to coordinate data transfer between CPU 101 and one or more devices (e.g., other computer systems) coupled to CPU 101 via a network. In one embodiment, communication adapter 107 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, communication adapter 107 may be configured to implement multiple discrete network interface ports.

User interface adapter 106 may be configured to transfer data between one or more peripheral devices configured to input data into computing system 100. In one embodiment, user interface adapter 106 may receive input from a keyboard and transfer the data to CPU 101. In other embodiments, user interface adapter 106 may receive and format data from a mouse or other suitable pointing device.

Display adapter 104 may be configured to transfer and format data from between CPU 101 and a display screen. In some embodiments, display adapter 104 may be configured to implement a display standard such as Super-VGA or High-Definition Multimedia Interface (HDMI). In other embodiments, display adapter 104 may be configured to implement multiple display interfaces.

The embodiment illustrated in FIG. 1 is merely an example. In other embodiments, different types and numbers of devices are possible and contemplated.

Figure 2:
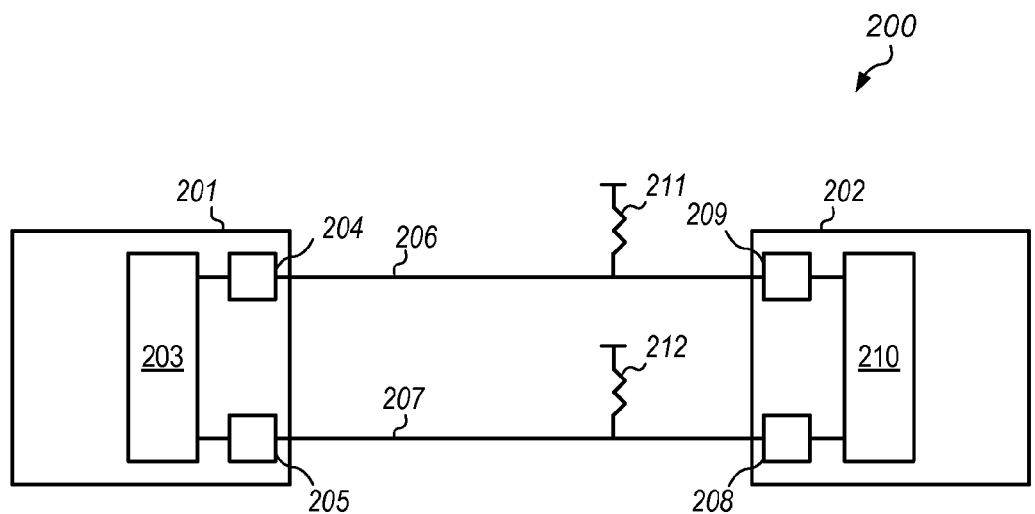
FIG. 2 illustrates another embodiment of a computing system.

Turning to FIG. 2, another embodiment of computing system is illustrated. In the illustrated embodiments, computing system 200 includes device 201 coupled bus 206 and bus 207, which are, in turn, coupled to device 202. Termination devices 211 and 212 are coupled to bus 206 and 207, respectively. In various embodiments, devices 201 and 202 may correspond to any of the functional blocks described above in referenced to computing system 100 as illustrated in FIG. 1.

Bus 206 and bus 207 may, in various embodiments, include multiple conductive traces on a circuit board, substrate, or any other material suitable for the implementation of a computing system, such as computing system 200, for example. In some embodiments, traces at a constant electrical potential may be inserted between the individual traces included in bus 206 and bus 207. Such traces (commonly referred to as "shields")

may, in various embodiments, reduce capacitive and inductive coupling between the individual traces of bus 206 and bus 207, thereby improving the integrity of the signals transmitted on busses 206 and 207.

Device 201 includes encoder 203, which is coupled to transmit circuits 204 and 205, which are, in turn, coupled to bus 206 and bus 207, respectively. In some embodiments, encoder 203 may be configured to encode data to be transmitted to device 202 via bus 206 and bus 207. The data may be encoded by one of various encoding methods such as, e.g., bit inversion, or any other suitable encoding method. Encoder 203 may also generate an error correction code for the data. The error correction code may be generated prior to encoding, or may be generated using the encoded data, and may include a Cyclic Redundancy Check (CRC) or any other suitable error checking code. Encoder 203 may be designed in accordance with one of numerous design styles. For example, encoder 203 may be a general-purpose processor executing program instructions stored in a memory, a dedicated logic circuit, a memory circuit configured to perform as a look-up table, or any other suitable circuit configured to encode data.

Transmit circuits 204 and 205 may be configured to translate voltage levels of the encoded data for transmission on bus 206 and bus 207, respectively. For example, transmit circuit 204 and 205 may each be configured to transmit data in accordance with the Low-Voltage Transistor-Transistor Logic (LVTTL) standard, or any other suitable voltage levels suitable for signaling from one device to another.

Termination devices 211 and 212 may, in various embodiments, be configured to match the impedance of bus 206 and 207 to the input impedance of receive circuits 208 and 209, respectively. It is noted that although termination devices 211 and 212 are depicted as resistors coupled to a power supply, in other embodiments, termination devices 211 and 212 may include resistors coupled to ground, combinations of resistors, capacitors, and inductors, or any other suitable collection of active or passive circuits elements capable of matching the aforementioned impedances.

Device 202 includes receive circuits 208 and 209 which are coupled to bus 206 and 207, respectively. Receive circuits 208 and 209 are further coupled to decoder 210. Receive circuit 208 and 209 may be configured to translate voltage levels on bus 206 and bus 207, respectively, to a voltage levels used by decoder 210. For example, receive circuits 208 and 209 may translate LVTTL voltage levels to Complementary Metal-Oxide Semiconductor (CMOS) voltage levels.

Decoder 210 may be configured to decode the encoded data received by receive circuits 208 and 209, thereby translating the received encoded data into a format that may be used by device 202. Decoder 210 may also analyze an error checking code such as, e.g., a CRC code, generated by encoder 203, to determine if errors were introduced during the transmission of the data via busses 206 and 207. In some embodiments, decoder 210 may signal to other logic circuits (not shown) within device 202 that the received data contains errors. Decoder 210 may, in other embodiments, attempt to correct the errors in cases where a sending device includes an Error Correction Code (ECC).

In some embodiments, decoder 210 may be designed in accordance with one of numerous design styles. For example, decoder 210 may be a general-purpose processor executing instructions stored in a memory, dedicated logic circuit, a memory device configured to perform as a look-up table, or any other suitable circuit for decoding the received encoded data.

It is noted that the embodiment of a computing system illustrated in FIG. 2 is merely an example. In other embodiments, different numbers of busses coupling different numbers of devices may be employed.

Simultaneously Switching Outputs

Data sent between integrated circuit may include multiple words (also referred to as "symbols") that include multiple data bits. When such data is transmitted between integrated circuits using a communication bus, such as, e.g., bus 206 as illustrated in FIG. 2, the individual bits included in the symbol may change from a high logic level to a low logic level or vice versa. The transition of multiple data bits from a low logic level to a high logic level may be referred to as Simultaneously Switching Outputs (SSO). It is noted that in some embodiments, a low or low logic level refers to a voltage level at or near ground potential, and a high or high logic levels refers to a voltage sufficiently large to turn on an n-channel Metal-Oxide Semiconductor Field-Effect Transistor (MOSFET) and turn off a p-channel MOSFET. In other embodiments, different technologies may result in different voltage levels for high and low logic levels.

Figure 3:
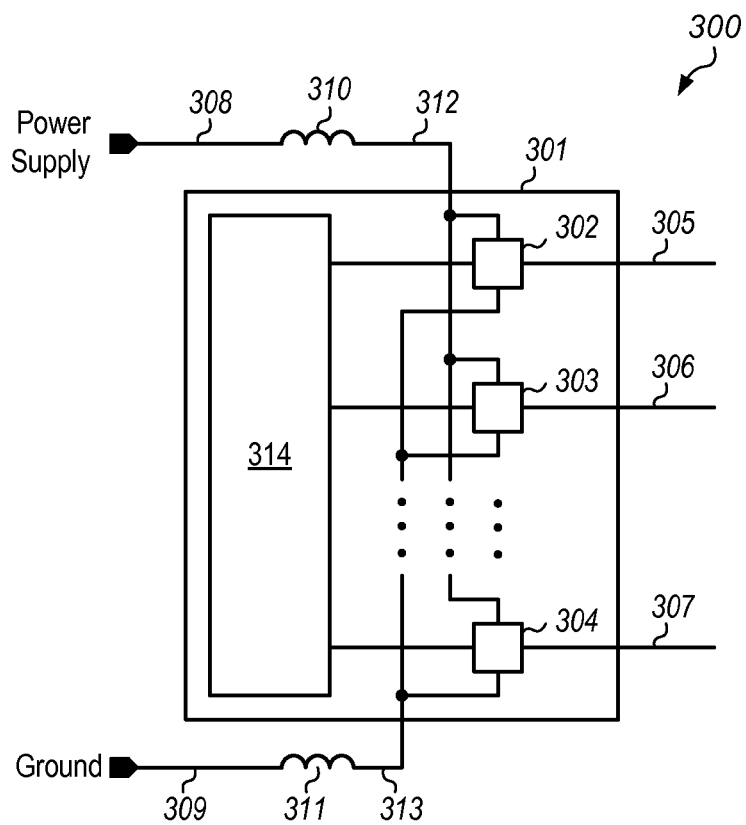
FIG. 3 illustrates an embodiment of an integrated circuit.

An embodiment of integrated circuit power supply system is illustrated in FIG. 3. In the illustrated embodiment, system 300 includes integrated circuit 301, which is coupled to power supply 308 through inductor 310. Integrated circuit 301 is further coupled to ground supply 309 through inductor 311. In various embodiments, inductors 310 and 311 may represent parasitic inductances of integrated circuit packages, power supply traces on a circuit board, and the like. Integrated circuit 301 may, in various embodiments, correspond to device 201 of computing system 200 as illustrated in FIG. 2.

Integrated circuit 301 includes logic block 314 coupled to transmit circuits 302 through 304, which are, in turn, coupled to wires 305 through 307, respectively. In some embodiments, wires 305 through 307 may be part of a communication bus, such as, e.g., bus 206 as depicted in FIG. 2, and transmit circuits 302 through 304 may collectively correspond to one of transmit circuits 204 or 205 of device 201 as illustrated in FIG. 2. Each of transmit circuits 302 through 304 may be configured to translate voltage levels internal to integrated circuit 301 to voltage levels necessary for transmission of the data bits on wires 305 through 307.

Logic block 314 may perform one of various functions. For example, logic block 312 may be a general-purpose processor configured to execute program instructions stored in a memory. In other embodiments, logic block 312 may be a memory or a dedicated state-machine logic circuit. Logic block 312 may, in various embodiments, perform encoding of data to be transmitted off-chip via wires 305 through 307.

During operation, when one of transmit circuits 302 through 304 charges a respective wire of wires 305 through 307 from a low logic level to a high logic level, current is drawn from power supply 308. As the current moves through inductor 310, a voltage may develop across inductor 310, which may result in the voltage level of internal power supply 312 to be less than the voltage level of power supply 308. In some embodiments, the drop on the voltage level of internal power supply 312 may increase when more transmit circuits are required to charge their respective wires to from a low logic level to a high logic level.

A similar result occurs when one of transmit circuits 302 through 304 discharges its respective wire to change the logic level on the wire from a high logic level to a low logic level. The current is steered into ground 309 through inductor 311. As described above, a voltage drop develops across inductor 311 which causes the voltage level of internal ground 313 to rise above the voltage level of ground 309, i.e., ground potential.

Variations in the voltage levels of internal supplies 312 and 313 may, in various embodiments, result in changes in operational or performance parameters of circuits within integrated circuit 301. A lower voltage level on internal power supply 312 may result in circuits within integrated circuit 301 to operate more slowly, which may prevent operation at an intended clock frequency. A higher voltage level on ground 313 may shift the reference level for outgoing signals on wires 305 through 307, which may, in turn, result in the misinterpretation of the logic levels of data bits when they are received at the far-end of wires 305 through 307. In some embodiments, circuits may be designed to provide additional margin in the overall system design in order to compensate for the aforementioned variation in the voltage levels of the internal power supplies. Such circuits may, in various embodiments, have a higher power consumption, be physically larger, and may result in lower manufacturing yield.

It is noted that the embodiment illustrated in FIG. 3 is merely an example. In other embodiments, different numbers of output drivers and different parasitic circuit elements may be possible.

Symbol Encoding and Decoding

In some embodiments, symbols to be transmitted are encoded, i.e., mapped from their native symbol space, to an alternative symbol space, in order to reduce the number of data bits within a symbol that must transition from a low logic level to a high logic level. When such a mapping is performed, it may, in various embodiments, reduce noise generated by SSO. For example, in various embodiments, a technique referred to as Bit Inversion (BI) may be employed.

Figure 4:
FIG. 4 illustrates a table of logic values and code words.

Turning to FIG. 4, a table illustrating the possible symbols for using four data bits is illustrated. In the first column of the table, the numeric (or "L value") of a given number is listed, and the in the second column of the table, the equivalent 4 data bit logical symbol (or "L-code") is listed. In the third column of the table, the number of high logic levels (or "logic 1 values") for each corresponding L-code is listed (commonly referred to as the "Hamming weight"). For example, the L-code value of "1111" (L value "1") contains four logic 1 values, while the L-code value of "0001" (L value "1") contains a single logic 1 value.

The symbols illustrated in FIG. 4 may be used to transmit numbers, i.e., numbers zero through fifteen, over a four data bit wide bus. As one number is transmitted after another, the change in Hamming weight of the corresponding symbols, determines how may output driver circuits of a integrated circuit, such as, e.g., device 201 as illustrated in FIG. 2, must charge or discharge a wire and corresponding load. For example, if the L-code symbol "0000" was transmitted, following the L-code symbol "1111," all four data bits must transition from a low logic level to a high logic level, thereby creating a high SSO situation. However, in the transition from transmitting L-code symbol "0011" to L-code symbol "1001," there is no SSO noise (also referred to herein as a being "silent") as the number of logic 1 values and the number of logic 0 values remains the same. In other words, the logic 1 values merely rearrange themselves within the 4 data bit wide space. In some embodiments, the use of symbols that contain an equal number of logic 1 values and logic 0 values may result in silent transmission of data from one integrated circuit to another. Symbols that result in little or no SSO generated noise may be referred to as "silent" or "S-code" symbols. While the table in FIG. 4 depicts numbers being represented in a four data bit code, in other embodiments, different number of data bits, allowing different numbers to be represented, may be employed.

Figure 5:
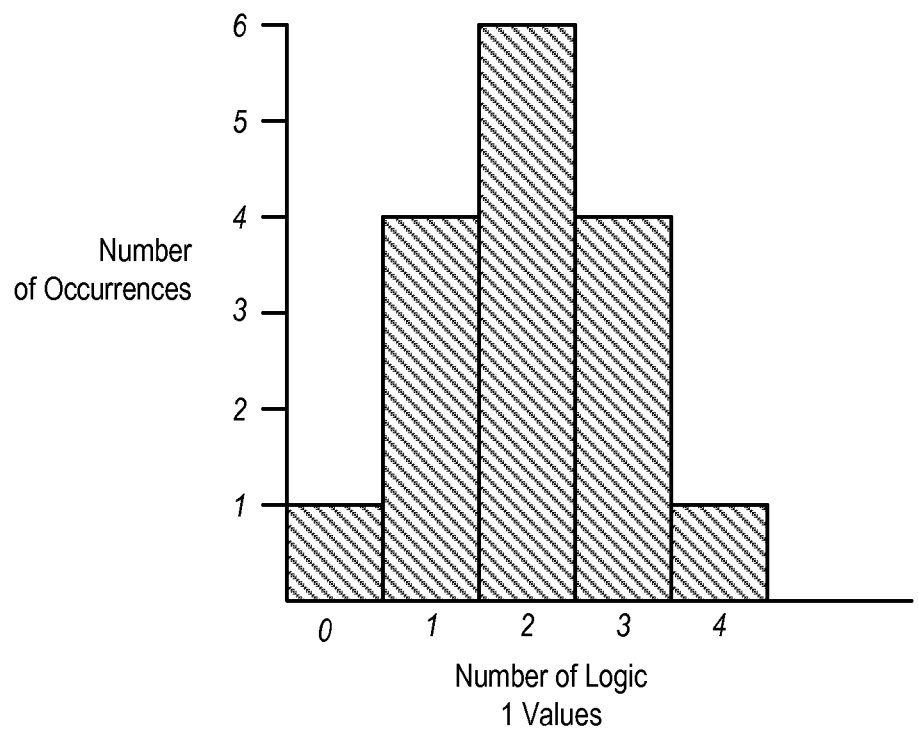
FIG. 5 illustrates a chart depicting a distribution of the number of logic 1 values within a set of logic code words.

The number of logic 1 values within the various code words that span a given data bit width vary. Turning to FIG. 5, a bar graph showing the distribution of the L-code words depicted in the table of FIG. 4 is illustrated. In the illustrated graph, the number of L-code words that contain a given number of logic 1 values (ranging from 0 to 4) is depicted. For example, there is exactly one L-code word, namely the L-code word "0000" that has no logic 1 values, and there is exactly one L-code word, namely the L-code word "1111" that has four logic 1 values. The rest of the L-code words contain either one, two, or three logic 1 values.

In the illustrated graph, the code words with two logic 1 values are the most prevalent, followed by code words with one or three logic 1 values. It is noted that the number of occurrences of code words with each given number of logic 1 values form the sequence "1 4 6 4 1." This sequence of numbers may, in various embodiments, correspond with the coefficients of a binomial expansion of order four. In general, for varying data bit widths, the number of code words with a given number of logic 1 values may be determined using the binomial expansion. For example, if code words using 5 data bits were to be transmitted, then, according to the binomial expansion, there would be one code word with no logic 1 values, five code words with one logic 1 value, 10 code words with five logic 1 values, and so forth. As described above, code words with an equal number of logic 1 values and logic 0 values may not generate SSO noise, and that for a given data bit width, code words contain fifty percent (or close to fifty percent) logic 1 values are the most frequently occurring. As described below in more detail, in some embodiments, only code words that have close to fifty percent logic 1 values may be used for transmission.

It is noted that the graph illustrated in FIG. 5 is merely an example. In other embodiments, different data bit widths of code words may result in different numbers of occurrences of code words with a given number of logic 1 values.

Figure 6:
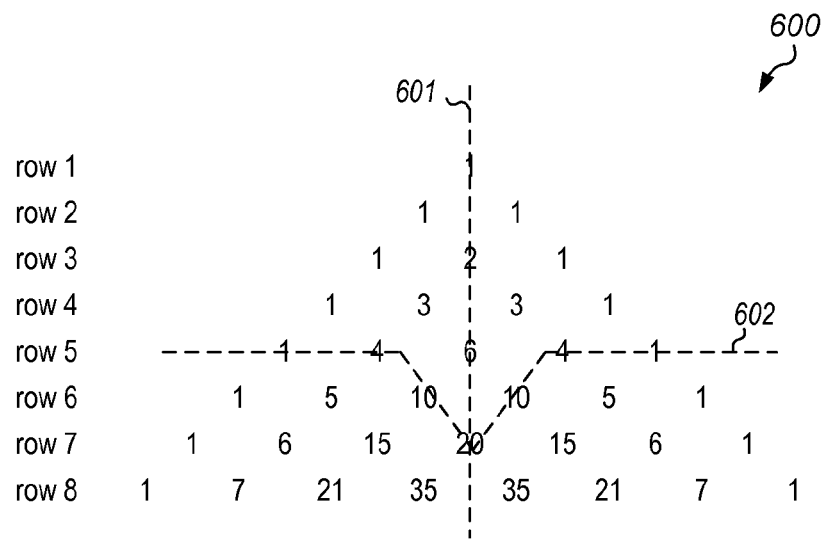
FIG. 6 illustrates an example of Pascal's Triangle.

A particular depiction of the binomial expansion is illustrated in FIG. 6. In the illustrated diagram, coefficients from various binomial expansions are arranged in rows to generate what is commonly referred to as "Pascal's Triangle." Since Pascal's Triangle graphically demonstrates the relationship between the number of symbols within a given number of logic 1 values for different data bit widths, in some embodiments, Pascal's Triangle may be used as a map to translate code words from one code space to another code space that has symbols that generate less SSO.

In the illustrated chart, line 601 indicates code words that have fifty percent logic 1 values. For example, in row 7, Pascal's Triangle indicates that there are 20 symbols that have fifty percent logic 1 values. In embodiments, where only symbols from the aforementioned group of 20 symbols are used in transmission, there may be no SSO generated noise.

Line 602, in the chart illustrated in FIG. 6, depicts an embodiment of how Pascal's Triangle may be employed to translate code words from one code space to another. Row 5 of the Pascal's Triangle depicted in FIG. 6 may correspond to a code space of four bit data words that includes 16 unique symbols. Line 602 indicates that by adding two more bits (which requires two additional wires for transmission between integrated circuits such as device 201 and device 202 as illustrated in FIG. 2) the 16 unique symbols of the four bit data word space may be all mapped onto the 20 silent symbols of a six bit data word space prior to transmission. When the mapped symbols are transmitted, no SSO noise may be generated. In general, any set of L-code symbols may be mapped onto a set of S-code symbols that has a higher cardinality than the set of L-code symbols.

In other embodiments, other mappings may be chosen that do not require, as many additional wires. For example, in the case of the four bit data word space, with one additional wire (which corresponds to row 6 of Pascal's Triangle), the symbols may be mapped into a combination of the 10 symbols that contain 2 logic 1 values and the 10 symbols that contain 3 logic 1 values that are part of the five bit data word code space. Such combinations of symbols may result in "quiet" transmission, i.e., transmission that is not silent, but less noisy than transmission of data that is not encoded.

It is noted that the version of Pascal's Triangle illustrated in FIG. 6 is merely an example. In other embodiments, other code mappings are possible and contemplated.

Figure 7:
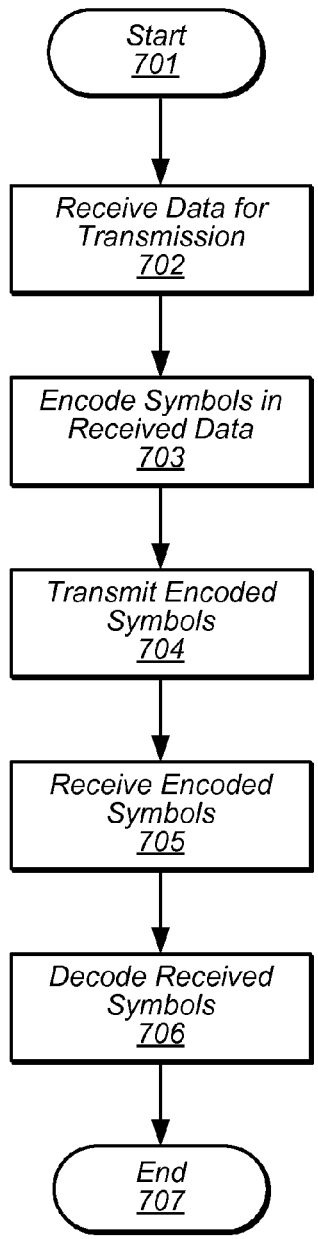
FIG. 7 illustrates a method of operating encoding and transmitting data in a computing system.

A flowchart depicting a method of encoding data to reduce SSO noise is illustrated in FIG. 7. Referring collectively to computing system 200 as illustrated in FIG. 2, and the flowchart of FIG. 7, the method begins in block 701. Within device 201, encoder 203 may then receive data to be transmitted to device 202 (block 702). In some embodiments, the data received by encoder 203 may be from one or more functional blocks (not shown) within device 201. A functional block within device 201 may, in various embodiments, send data to encoder 203 to be transmitted, in response to a request from another device, such as, device 202, for example.

Encoder 203 may then examine each received signal and map, i.e., encode, to a new code space (block 703). In some embodiments, the new code space may be selected dependent upon a desired level of SSO noise. A code space containing silent symbols may, in some embodiments, be selected, while in other embodiments, a code space that requires less additional wires, i.e., a quiet code space, between the two devices may be selected. The data received by encoder 203 may, in various embodiments, be in a binary format, a Binary Coded Decimal (BCD), or any other suitable format. Encoder 203 may, in other embodiments, also encode the mapped word with an Error Correction Code (ECC), Cyclic Redundancy Check (CRC), or any other suitable error check code.

With the encoding of the data complete, encoder 203 may then send the encoded data to transmit circuits 204 and 205, which in turn, transmit the encoded data to device 202, via wires 206 and 207, respectively (block 704). Transmit circuits 204 and 205 may, in various embodiments, convert voltage levels of the encoded data before transmission. In other embodiments, transmit circuits 204 and 205 may adjust a bias level of the encoded data prior to transmission. Transmit circuits 204 and 205 may send data in accordance with one of various industry standard protocols, such as, PCI Express™, for example.

The transmitted data may then be received by receive circuits 208 and 209 of device 202 (block 705). In some embodiments, receive circuits 208 and 209 may convert the voltage levels of the received data to be compatible with an operating voltage level of device 202. Receive circuits 208 and 209 may, in other embodiments, adjust a bias level adjustment to match the data by transmit circuits 204 and 205.

Once the transmitted data has been received by receive circuits 208 and 209, the received data may then be sent to decoder 210, where it is converted back into its original encoding format (block 706). In some embodiments, decoder 210 may also correct any errors resulting from the transmission of the data using an ECC data word that may have been sent along with the encoded data. Decoder 210 may, in various embodiments, employ a general-purpose processor, look-up table (LUT), or any other suitable circuit for the purposes decoding the encoded data. The decoded data may then be sent to one or more functional blocks (not shown) within device 202, at which point the method concludes in block 707. In some embodiments, transmitting data from one device to another using the method depicted in the flowchart of FIG. 7 may result in reduced SSO noise.

It is noted that the method illustrated in FIG. 7 is merely an example. In other embodiments, different operations or different orders of operations are possible.

Figure 8:
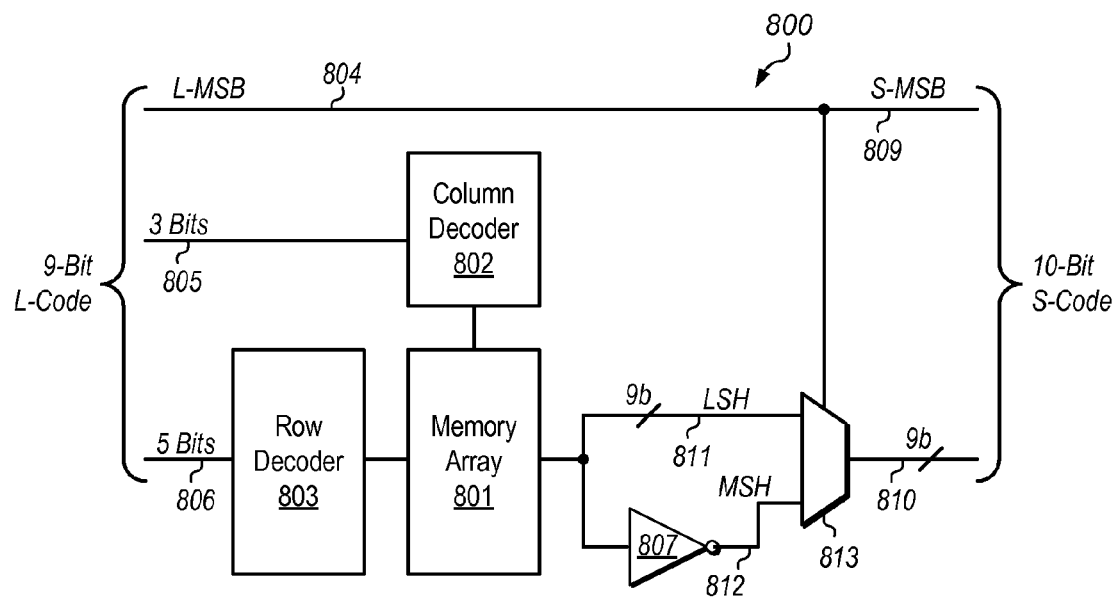
FIG. 8 illustrates an embodiment of an encoder circuit.

Turning to FIG. 8, an embodiment of a encoder unit, such as, e.g., encoder unit 203 as depicted in FIG. 2, is illustrated. In the illustrated embodiment, encoder 800 includes memory array 801, column decoder 802, row decoder 803, inverter 807, and multiplex circuit 813. Memory array 801 is coupled to column decoder 802 and row decoder 803. Memory array 801 is further coupled to inverter 807, and multiplex circuit 813, and the output of inverter 807 is also coupled to multiplex circuit 813.

Memory array 801 may include multiple data storage cells of any suitable type of memory such as a Dynamic Random Access Memory (DRAM), a Static Random Access Memory (SRAM), a Read-only Memory (ROM), Electrically Erasable Programmable Read-only Memory (EEPROM), a FLASH memory, or a Ferroelectric Random Access Memory (Fe-RAM), for example. In some embodiments, memory block 102 may be configured to store S-code symbols that may be accessed by an L-code symbol.

Column decoder 802 may, in various embodiments, be configured to decode 3-bits of a 9-bit L-code. The decode bits may be used to select one or more bit lines from array 801. Column decoder 802 may be designed according to one of various design styles. For example, column decoder 802 may employ dynamic circuits in which a series of circuit nodes are pre-charged to a pre-determined voltage, and then selectively discharged dependent on the values of the 3-bits 805. In other embodiments, static logic gates may be employed.

In a similar fashion, row decoder may be configured to decoder 5-bits (806) of the 9-bit L-code to produce row selection signals for memory array 801. In various embodiments, the row selection signals may activate one or more data storage cells within memory array 801 allowing data to be read from or written to the activate data storage cells.

Inverter 807 may, in various embodiments, include multiple CMOS inverters each of which may be configured to invert the logical sense of a single bit of bus 811. The multiple CMOS inverters may, in other embodiments, generate a bit-wise inversion of the 9-bits of bus 811 to generate bus 812 (also 9-bits wide).

Static complementary metal-oxide-semiconductor (CMOS) inverters, such as those shown and described herein, may be a particular embodiment of an inverting amplifier that may be employed in the circuits described herein. However, in other embodiments, any suitable configuration of inverting amplifier that is capable of inverting the logical sense of a signal may be used, including inverting amplifiers built using technology other than CMOS.

Multiplex circuit 813 may be configured to select between bus 811 of the output of memory array 801 and bus 812. In some embodiments, multiplex circuit 813 may include nine multiplex circuits, each of which may be configured to select between respective bits of the bus 811 and bus 812. Each multiplex circuit may be designed in accordance with numerous design styles. For example, each multiplex circuit may include one or more pass gates control by S-code MSB 809. The output of each pass gate may be coupled together in a wired-OR fashion.

It is noted that a pass gate (also referred to as a "transmission gate") may include an n-channel metal-oxide-semiconductor field-effect transistor (MOSFET) and a p-channel MOSFET connected in parallel. In other embodiments, a single n-channel MOSFET or a single p-channel MOSFET may be used as a pass gate. It is further noted that, in various embodiments, a "transistor" may correspond to one or more transconductance elements such as a junction field-effect transistor (JFET), for example.

During operation, 5-bits (bus 806) of the input 9-bit L-code symbol may be decoded by row decoder 803 to activate data storage cells within memory array 801. Column decoder 802 may then use another 3-bits (bus 805) of the input 9-bit L-code symbol to select data from the activated data storage cells within memory array 801 for output onto bus 811. The Most-Significant-Bit (MSB) of the input 9-bit L-code (804) may be used as the Most-Significant-Bit (MSB) of the resultant 10-bit S-code (809). In some embodiments, a portion of the S-code space used in the encoding may be selected. For example, the S-code MSB (809) may be used to operate multiplex circuit 813 to select between a Most-Significant-Half (bus 812) or a Least-Significant-Half (bus 811) of the code space as output from memory array 801. The selected portion of the S-code space used in the encoding process may, in various embodiments, be inversion-symmetric, i.e., the portion of the S-code space includes only symbol pairs that are bit-by-bit inversions of each other.

Once either the Most-Significant-Half, or the Least-Significant-Half of the output of memory array 801 has been selected, the selected data may then be combined with S-code MSB 809 to form a complete symbol for the desired 10-bit S-code.

It is noted that the embodiment illustrated in FIG. 8 is merely an example. In other embodiments, different functional blocks or different arrangements of functional block may be employed.

Figure 9:
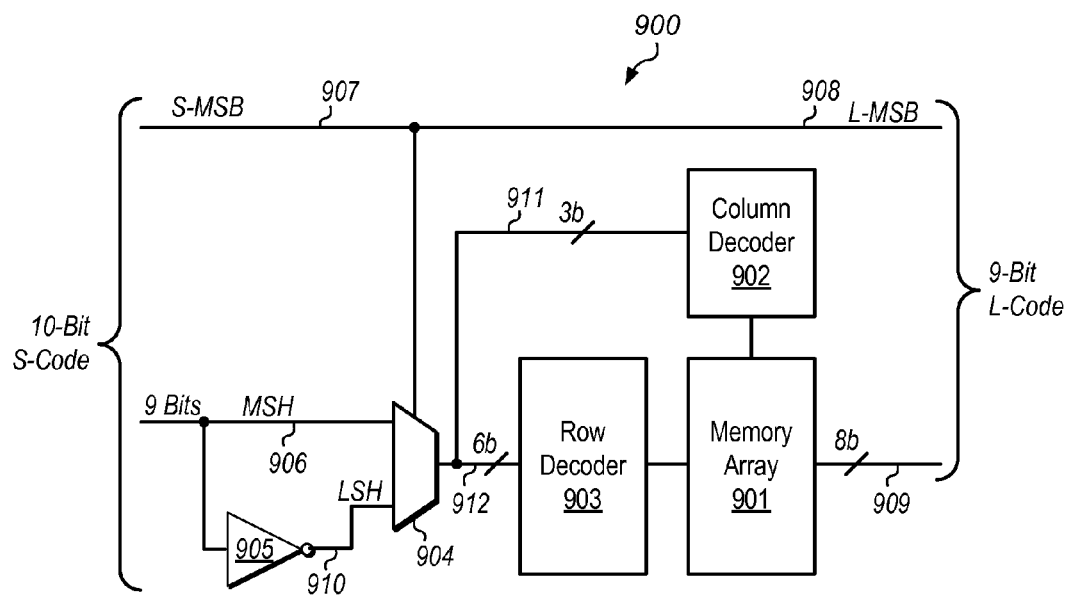
FIG. 9 illustrates an embodiment of a decoder circuit.

An embodiment of a decoder unit, such as, e.g., decoder unit 210 as depicted in FIG. 2, is illustrated in FIG. 9. In the illustrated embodiment, decoder unit 900 includes memory array 901, column decoder 902, row decoder 903, multiplex circuit 904, and inverter 905. Memory array 901 is coupled to column decoder 902 and row decoder 904. The output of multiplex circuit 904 is coupled to the both column decoder 902 and row decoder 903. The input of multiplex circuit 903 is coupled to 9-bits (906) of a 10-bit S-code and to the output of inverter 905.

Memory array 901 may include multiple data storage cells of any suitable type of memory such as a Dynamic Random Access Memory (DRAM), a Static Random Access Memory (SRAM), a Read-only Memory (ROM), Electrically Erasable Programmable Read-only Memory (EEPROM), a FLASH memory, or a Ferroelectric Random Access Memory (Fe-RAM), for example. In some embodiments, memory block 102 may be configured to store L-code symbols that may be accessed by a decoded S-code symbol.

Column decoder 902 may be configured to decode 3-bits of the 9-bit output of multiplex circuit 904. The output of column decoder 902 may, in various embodiments, be used to select one or more bit lines inside memory array 901. In some embodiments, as described below in more detail in regard to FIG. 10, column decoder 902 may be organized by Hamming Weight of the various combinations of the 3-bits input to column decoder 902.

Row decoder 903 may be configured to decode 6-bits of the 9-bit output of multiplex circuit 904. In various embodiments, the output of row decoder 903 may be used to activate one or more data storage cells within memory array 901 to allow data to be read from or written to the activated storage cells. Row decoder 903 may, in some embodiments, be organized by Hamming Weight of the various combinations of the 6-bits input to row decoder 903 as described below in more detail in regard to FIG. 10.

Inverter 905 may, in various embodiments, include multiple CMOS inverters each of which may be configured to invert the logical sense of a single bit of 9-bits (906) of a 10-bit S-code. The multiple CMOS inverters may, in other embodiments, generate a bitwise inversion of the 9-bits (bus 906) of the 9-bit S-code on bus 910.

Multiplex circuit 904 may be configured to select between 9-bits (bus 906) of a 10-bit S-code and the inverted data on bus 910 dependent upon the state of the Most-Significant-Bit (MSB) of the 10-bit S-code (907). In some embodiments, multiplex circuit 904 may include nine multiplex circuits, each of which may be configured to select between respective bits of the bus 906 and bus 910. Each multiplex circuit may be designed in accordance with numerous design styles as described above in more detail in regarding to multiplex circuit 813 as depicted in FIG. 8.

During operation, the MSB of the 10-bit S-code (907) is used as the MSB of the resultant 9-bit L-code (908). In some embodiments, the portion of the S-code space used in encoding may be inversion-symmetric, i.e., the portion of the S-code space includes only symbol pairs that are bit-by-bit inversions of each other. In such cases, S-code MSB 907 may be used to operate multiplex circuit 904 to select between a Most-Significant-Half (bus 906) or a Least-Significant-Half of the 9-bit portion of the 10-bit S-code to be decoded.

Once either the Most-Significant-Half, or the Least-Significant-Half of the 9-bit portion of the S-code has been selected, column decoder 902 and row decoder 903 decode bus 911 and bus 912, respectively, to activate data storage cells within memory array 901, and select the data from some of the activated data storage cells for output on bus 909. Bus 909 may then be combined with L-code MSB 908 to form a complete symbol for the desired 9-bit L-code.

Although the decoder unit illustrated in FIG. 9 depicts a 10-bit S-code decoded to a 9-bit L-code, it is noted that this is merely an example. In other embodiments, S-codes and L-codes whose symbols include different numbers of data bits are possible and contemplated.

As illustrated in FIG. 8 and FIG. 9, a look-up table implementation of an encoder and decoder may, in various embodiments, provide low latency and high area efficiency. In order to implement such a look-up table, however, it is necessary to determine a method by which logical binary codes (L-codes) may be mapped onto silent codes (S-codes) and vice versa. In the case of mapping L-codes into S-codes, the L-codes may map directly onto a memory decode structure due to the binary nature of L-codes. As a result, little insight into how to select an efficient mapping is provided. Since S-code space is not binary, the various symbols within a given S-code space may not map directly onto a traditional binary memory decode structure.

Figure 10:
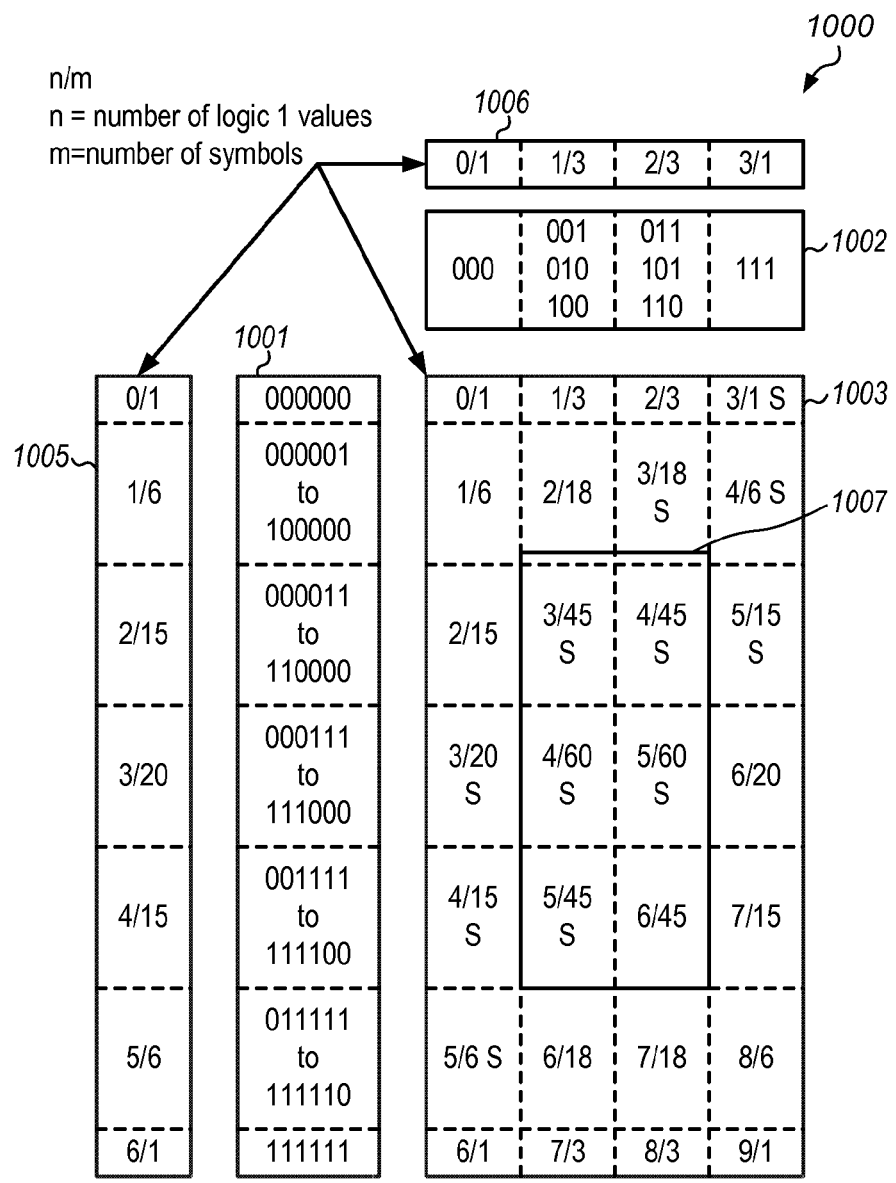
FIG. 10 illustrates an embodiment of a memory array.

A functional block diagram of a memory depicting a mapping from S-code space to L-code space is illustrated in FIG. 10. In the illustrated embodiment, memory 1000 includes row decoder 1001, column decoder 1002, array 1003, row information block 1105, and column information block 1106. It is noted that embodiment illustrated in FIG. 10, some of the blocks depicted are for illustrative purposes and that in actual circuit implementations, such blocks may not be included.

Row decoder 1001 is configured to six address bits from a data word in a S-code space, and is organized such that addresses containing the same number of logic 1 (i.e., each address within an address group has the same Hamming Weight) values are grouped together within address groups.

In various embodiments, different orders of symbols within an address group are possible. Although a six bit address decode is shown, in various other embodiments, different number of bits may be employed in row decoder 1001.

Column decoder 1002 is configured to decode three address bits from a data word in an S-code space. As with row decoder 1001, column decoder is also organized in address groups by the number of logic 1 values, and the order of addresses within a group may vary from one embodiment to another. It is noted that in other embodiments, different numbers of bits may be employed in column decoder 1002.

Blocks 1005 and 1006 are depicted for the purposes of illustration. In actual circuit implementations of memory 1000, blocks 1005 and 1006 may not be included in the design. Each group within block 1005 indicates the number of logic 1 values and the number of symbols within the corresponding address group of row decoder 1001. In a similar fashion, each group within block 1006 indicates the number of logic 1 values of the each symbol and the number of symbols within the corresponding address group of column decoder 1002.

Within array 1003, each group indicates the number of logic 1 values within the symbols of that group, and the total number of symbols within the group. In some embodiments, the total number of symbols within the group may be determined by multiplying the number of symbols in the corresponding row address group by the number of symbols in the corresponding column address group. Groups within array 1003 with the designation "S" may be selectable by data words within the S-code to be decoded. In the illustrated embodiment, the S-code is a combination of the number of combinations of arranging three, four, and five logic 1 values over nine data bits. In various other embodiments, different numbers of data bits, and different numbers of logic 1 values may be employed.

Since the L-code space is smaller, i.e., has less symbols, than the total S-code space, in some embodiments, only a portion of the S-code space may be employed. In the illustrated embodiment, block 1007 indicates such a portion of the S-code space. In some embodiments, block 1007 may correspond to memory array 901 of decoder 900 as illustrated in FIG. 9. Block 1007 may be selected by determining a minimum rectangle that includes sufficient S-code entries for the desired number of L-code symbols. In the illustrated embodiment, 51 rows and 6 columns have been selected (as indicated by block 1007), resulting in 258 addressable locations within array 1004. This provides sufficient entries for the desired 256 8-bit L-code symbols ($2^8$=256).

In various embodiments, only the portion of array 1004 may be used in implementing a decoder, such as, e.g., decoder 900 as illustrated in FIG. 9. By using only a portion of array 1004, a decoder may, in various embodiments, consume less area and have a higher efficiency.

It is noted that the functional diagram of the memory illustrated in FIG. 10 is merely an example. In other embodiments, different arrangements of decoders and array blocks are possible and contemplated.

Figure 11:
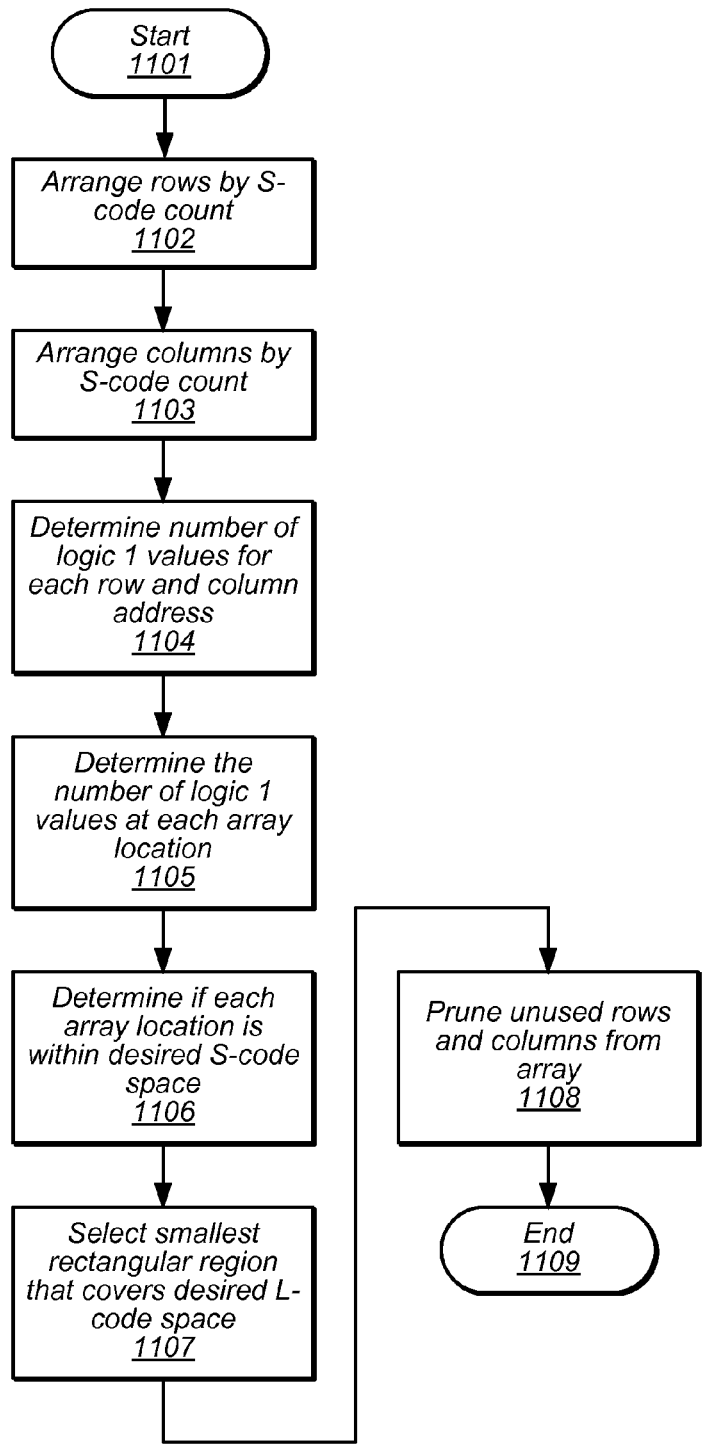
FIG. 11 illustrates a method for organizing a memory array for use as an encoder.

Turning to FIG. 11, an embodiment of a method for organizing a memory, such as the memory illustrated in FIG. 10, for example, is illustrated. Referring collectively to the memory illustrated in FIG. 10 and the flowchart depicted in FIG. 11, the method begins in block 1101. Row decoder 1001 may then be arranged according to S-code count, i.e., Hamming weight (block 1102). In some row decoder 1001 is divided into sections based on the number of logic 1 values. Within each section, various orders of symbols are possible. For example, in the section of row decoder 1001 that includes one logic 1 value, the values may be organized as 0x000001, 0x000010, 0x000100, and so forth.

Once row decoder 1001 has been arranged, column decoder 1002 may then be arranged according to S-code count (block 1103). In a similar fashion to that described above regarding row decoder 1001, the individual sections of column decoder 1102 may be arranged in various orders.

With the completion of the arrangement of row decoder 1001 and column decoder 1002, the number of logic 1 values within each section of the respective decoders may then be determined (block 1104). As illustrated in FIG. 10, blocks 1005 and 1006 contain the number of logic 1 values for row decoder 1001 and column decoder 1002, respectively. It is noted that block 1005 and 1006 are for the purposes of illustration, and in various embodiments, may not actually be part of the memory circuitry.

For each section within array 1003, the number of symbols and the number of logic 1 values within those symbols are determined (block 1105), and then each section may then be checked to determine if the symbols are within the desired S-code space (block 1106). For example, in the embodiment illustrated in FIG. 10, sections of array 1003 indicated with the letter "S" contain symbols within the S-code space containing all 9-bit symbols containing three, four, and five logic 1 values.

A rectangular array covering as many symbols as necessary to cover the desired L-code space may then be selected (block 1107). In the embodiment illustrated in FIG. 10, the selected portions of array 1004 are designated by rectangle 1107. In this particular embodiment, 51 rows and 6 columns have been selected, resulting in 258 addressable locations within array 1004. To cover the desired 8-bits of the L-code space, only 256 addressable locations are necessary. In some embodiments, the process of selecting the minimum necessary address locations is analogous to Karnaugh Map logic minimization.

Once the minimum necessary address locations have been identified, unused portions of the array 1004 may be eliminated (block 1108). In some embodiments, unused row decode circuits, column decode circuits, sense amplifiers, and the like may also be eliminated. The resultant array may correspond, in various embodiments, to array 901 of decoder circuit 900 as illustrated in FIG. 9. The method may then conclude in block 1109. In some embodiments, organizing the memory in a fashion similar to the method illustrated in FIG. 11 may result in smaller area and higher array efficiency.

It is noted that the method illustrated in FIG. 11 depicts operations being performed in a sequential fashion. In other embodiments, one or more of the illustrated operations may be performed in parallel.

Numerous variations and modifications will become apparent to those skilled in the art once the above disclosure is fully appreciated. It is intended that the following claims be interpreted to embrace all such variations and modifications.

What is claimed is:
1. An apparatus, comprising:
a row decode circuit configured to decode a first portion of a given data word of a first plurality of data words, wherein each data word of the first plurality of data words includes N data bits, and wherein N is a positive integer greater than one;
a column decode circuit configured to decode a second portion of the given data word of the first plurality of data words, wherein the second portion is not the same as the first portion;

a memory array coupled to the row decode circuit and the column decode circuit, wherein the memory array is configured to:
  store a second plurality of data words, wherein each data word of the second plurality of data words includes M data bits, and wherein M is a positive integer greater than N; and
  retrieve a given data word of the second data words dependent upon the decoded first portion of the given data word and the decoded second portion of the given data word.

2. The apparatus of claim 1, wherein each data word of the second plurality of data words includes an equal number of logic 1 values and logic 0 values.

3. The apparatus of claim 1, further comprising an Error Correction Code (ECC) unit, wherein the ECC unit is configured to generate an ECC for the given data word of the first plurality of data words.

4. The apparatus of claim 1, wherein the memory array comprises a plurality of read-only memory (ROM) data storage cells.

5. The apparatus of claim 1, wherein a data bit of the N data bits of the given data word is combined with the M data bits of the retrieved given one of the second plurality of data words.

6. The apparatus of claim 5, wherein the data bit of the N data bits comprises a Most-Significant-Bit (MSB) of the N data bits.

7. The apparatus of claim 1, further comprising a plurality of inverters, wherein each inverter of the plurality of inverters is configured to invert a respective data of the retrieved given word of the second plurality of data words.

8. A method, comprising:
  receiving data to be transmitted to a receiver, wherein the data includes a first plurality of symbols, and wherein each symbol of the first plurality of symbols includes N data bits, wherein N is a positive integer greater than one;
  decoding a first portion of a given symbol of the first plurality of symbols;
  decoding a second portion of the given symbol of the first plurality of symbols, wherein the second portion is different from the first portion; and
  retrieving, from a memory, a symbol from a second plurality of symbols dependent upon the decoded first and second portions of the given symbol of the first plurality of symbols, wherein each symbol of the second plurality of symbols includes M data bits, wherein M is a positive integer greater than N.

9. The method of claim 8, wherein M is greater than or equal to N plus two.

10. The method of claim 8, wherein each symbol of the second plurality of symbols includes an equal number of logic 1 values and logic 0 values.

11. The method of claim 8, wherein the memory comprises a read-only memory (ROM).

12. The method of claim 8, further comprising generating an Error Correction Code (ECC) for each symbol of the first plurality of symbols.

13. The method of claim 8, further comprising combining a data bit of the N data bits of the given symbol of the first plurality of symbols with the retrieved symbol of the second plurality of symbols.

14. The method of claim 13, wherein the data bit of the N data bits of the given symbol of the first plurality of symbols comprises a Most-Significant-Bit of the N data bits.

15. An apparatus, comprising:
  a row decode circuit configured to decode a first portion of a given data word of a first plurality of data words, wherein each data word of the first plurality of data words includes N data bits, and wherein N is a positive integer greater than one;
  a column decode circuit configured to decode a second portion of the given data word of the first plurality of data words, wherein the second portion is not the same of the first portion;
  a memory array coupled to the row decode circuit and column decode circuit, wherein the memory array is configured to:
    store a second plurality of data words, wherein each data word of the second plurality of data words include M data bits, wherein M is a positive integer greater than one and less than N; and
    retrieve a given data word from the stored second plurality of data words dependent upon the decoded first and second portions of the given data word of the first plurality of data words.

16. The apparatus of claim 15, wherein each data word of the second plurality of data words comprises a binary encoded data word.

17. The apparatus of claim 15, wherein M is less than or equal to N minus one.

18. The apparatus of claim 15, wherein the memory array comprises a plurality of read-only memory (ROM) data storage cells.

19. The apparatus of claim 15, further comprising a plurality of inverters, wherein each inverter of the plurality of inverters is configured to invert a respective data bit of a portion of the given data word of the first plurality of data words.

20. The apparatus of claim 19, further comprising a multiplex circuit coupled to the row decode circuit and the column decode circuit, wherein the multiplex circuit is configured to select the portion of the given data word of the outputs of the plurality of inverters.

* * * * *